United States Patent
Kim

(10) Patent No.: US 10,015,422 B1
(45) Date of Patent: Jul. 3, 2018

(54) ANALOG-TO-DIGITAL CONVERTER AND ANALOG-TO-DIGITAL CONVERSION METHOD

(71) Applicant: SK hynix Inc., Gyeonggi-do (KR)

(72) Inventor: Tae-Gyu Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/727,795

(22) Filed: Oct. 9, 2017

(30) Foreign Application Priority Data

Dec. 29, 2016 (KR) ........................ 10-2016-0182205

(51) Int. Cl.
| | |
|---|---|
| H03M 1/12 | (2006.01) |
| H04N 5/357 | (2011.01) |
| H04N 5/369 | (2011.01) |
| H03M 1/38 | (2006.01) |
| H04N 5/378 | (2011.01) |
| H04N 5/3745 | (2011.01) |

(52) U.S. Cl.
CPC ........ H04N 5/3575 (2013.01); H03M 1/1245 (2013.01); H03M 1/38 (2013.01); H04N 5/3698 (2013.01); H04N 5/378 (2013.01); H04N 5/37455 (2013.01)

(58) Field of Classification Search
CPC ..... H04N 5/3575; H04N 5/3698; H03M 1/38; H03M 1/1245
USPC ........................................ 341/155, 166, 169
See application file for complete search history.

(56) References Cited

U.S. PATENT DOCUMENTS

| | | | | |
|---|---|---|---|---|
| 6,933,972 B2 * | 8/2005 | Suzuki | .................. | H04N 9/045 250/208.1 |
| 7,710,479 B2 * | 5/2010 | Nitta | .................. | H03M 1/1023 348/297 |
| 8,520,110 B2 * | 8/2013 | Kitami | ............... | H04N 5/23245 250/208.1 |
| 9,093,340 B2 * | 7/2015 | Ono | .................. | H01L 27/14601 |

FOREIGN PATENT DOCUMENTS

| | | |
|---|---|---|
| KR | 101047296 | 7/2011 |
| KR | 1020140113224 | 9/2014 |

* cited by examiner

*Primary Examiner* — Brian Young
(74) *Attorney, Agent, or Firm* — IP & T Group LLP

(57) ABSTRACT

An analog-to-digital conversion method may include: generating an initial comparison signal by storing adjacent pixel signals and comparing the adjacent pixel signals, and generating a first control signal based on the generated initial comparison signal; generating a reference comparison signal by comparing the adjacent pixel signals based on the reference signal and a ramp-up signal switched according to the generated first control signal, and determining a ramping direction according to the generated reference comparison signal and generating a second control signal; and performing data conversion by selecting any one of the ramp-up signal and a ramp-down signal according to the generated second control signal, and by comparing the selected ramp signal with a 'difference value between the adjacent pixel signals'.

13 Claims, 11 Drawing Sheets

ANALOG-TO-DIGITAL CONVERTER AND ANALOG-TO-DIGITAL CONVERSION METHOD

CROSS-REFERENCE TO RELATED APPLICATION

This application claims priority under 35 U.S.C. § 119 to Korean Patent Application No. 10-2016-0182205 filed on Dec. 29, 2016 in the Korean Intellectual Property Office, the disclosure of which is incorporated herein by reference in its entirety.

TECHNICAL FIELD

Exemplary embodiments relate to an image sensor, and more particularly, a complementary metal oxide semiconductor (CMOS) image sensor (CIS) including an analog-to-digital converter.

DISCUSSION OF THE RELATED ART

Generally, CMOS image sensors (CISs) which are embodied through CMOS processes are expanding rapidly into markets due to advantages of low power consumption, low cost and a small size compared to other competitive products. Particularly, as the image quality of CISs which has been relatively insufficient compared to that of competitive products is improved, their application field is widening to include video applications requiring both a high resolution and a high frame rate.

Such a CIS compares a reset signal corresponding to a pixel signal before an optical signal is incident, with an image signal corresponding to a pixel signal after the optical signal is incident in order to remove an undesired offset value existing intrinsically in a pixel, and measures only a pixel signal resulting from substantial incident light. This technique is called correlated double sampling (CDS).

The CIS counts a difference between the reset signal and the image signal which are sampled using CDS, and outputs the counted value as a digital signal. When converting each pixel signal through analog-to-digital conversion, the CIS uses a ramp signal which sequentially decreases from a high to a low value, or increases from a low to a high value. The CDS may remove a process variation in the pixel transistors for example, threshold voltage variation, and a line resistance characteristic depending on the position of the pixels, while transmitting the difference between the reset signal and the image signal. Therefore, the CDS exhibits a satisfactory noise characteristic.

In a high-resolution CIS, however, as the size of a pixel or unit pixel is decreased while the size of a pixel array is increased, analog-to-digital converters of respective columns are further closer to each other, the number of switching operations in a unit pixel is increased, and the amount of data to be processed is increased. Therefore, noise caused by counting and power noise caused by an increase in the consumed power may be increased, thereby causing a concern during a data conversion process. Thus, there is a demand for a method which is capable of reducing noise, shortening a data conversion time, and lowering the number of counting operations, in order to implement a high-resolution and high-speed CMOS image sensor.

SUMMARY

Various embodiments are directed to an analog-to-digital converter and an analog-to-digital conversion method capable of canceling noise caused when a pixel signal is extracted, capable of increasing data processing speed and minimizing standby power consumption by reducing a data conversion time, and capable of reducing counter power consumption by reducing the number of counting operations.

In an embodiment, an analog-to-digital converter may include: a ramp signal generator suitable for generating a ramp-up signal and a ramp-down signal; a first correlated double sampling (CDS) block suitable for receiving and storing a pixel signal of a comparison column and performing CDS; a second CDS block suitable for receiving and storing a pixel signal of an adjacent column, and performing CDS; a comparison block suitable for generating an initial comparison signal by comparing adjacent pixel signals provided from the first and second CDS blocks, generating a reference comparison signal by comparing the adjacent pixel signals according to a reference signal inputted through the first CDS block and the ramp-up signal inputted through the second CDS block, and comparing any one signal selected from the ramp-up signal and the ramp-down signal with a difference value between the adjacent pixel signals; a feedback control unit suitable for outputting a first control signal based on the Initial comparison signal, and determining a ramping direction based on the reference comparison signal and outputting a second control signal; a reference signal switching block suitable for switching the reference signal to be applied to the first CDS block according to the first control signal; a ramp signal select block suitable for selecting the ramp-up signal to be applied to the second CDS block according to the first control signal, and selecting the ramp-up signal or the ramp-down signal to be applied to the second CDS block according to the second control signal; and a data conversion unit suitable for performing a data conversion operation according to a comparison signal of the comparison block.

In an embodiment, an analog-to-digital converter may include: a first correlated double sampling (CDS) block suitable for receiving and storing a pixel signal of a comparison column and performing CDS; a second CDS block suitable for receiving and storing a pixel signal of an adjacent column and performing CDS; a comparison block suitable for generating an initial comparison signal by comparing adjacent pixel signals provided from the first and second CDS blocks, and generating a reference comparison signal by comparing the adjacent pixel signals according to reference signals inputted through the first and second CDS blocks, and comparing any one signal selected from ramp signals to be applied to the first and second CDS blocks with a difference value between the adjacent pixel signals; a feedback control unit suitable for outputting a first control signal based on the initial comparison signal, and determining a ramp signal switching direction based on the reference comparison signal, and outputting a second control signal; a reference signal switching block suitable for switching the reference signals to be applied to the first and second CDS blocks according to the first control signal; a ramp signal select block suitable for selecting the ramp signal to be applied to the first or second CDS block according to the second control signal; and a data conversion unit suitable for performing a data conversion operation according to a comparison signal of the comparison block.

In an embodiment, an analog-to-digital conversion method may include: generating an initial comparison signal by storing adjacent pixel signals and comparing the adjacent pixel signals, and generating a first control signal based on the initial comparison signal; generating a reference comparison signal by comparing the adjacent pixel signals based on a ramp-up signal and a reference signal switched according to the first control signal, and generating a second control signal by determining a ramping direction according to the reference comparison signal; and performing a data conversion operation by selecting any one of the ramp-up signal and a ramp-down signal according to the second control signal, and by comparing the selected ramp signal with a difference value between the adjacent pixel signals.

In an embodiment, an analog-to-digital conversion method may include: generating an initial comparison signal by storing adjacent pixel signals and comparing the adjacent pixel signals, and generating a first control signal based on the initial comparison signal; generating a reference comparison signal by comparing the adjacent pixel signals based on reference signals switched according to the first control signal, and generating a second control signal by determining a ramp signal switching direction according to the reference comparison signal; and performing a data conversion operation by interrupting any one of the reference signals to be applied to first and second CDS blocks according to the second control signal, by selecting any one ramp signal to be applied to the first or second CDS block, and by comparing the selected ramp signal with a difference value between the adjacent pixel signals.

DETAILED DESCRIPTION

Figure 1A:
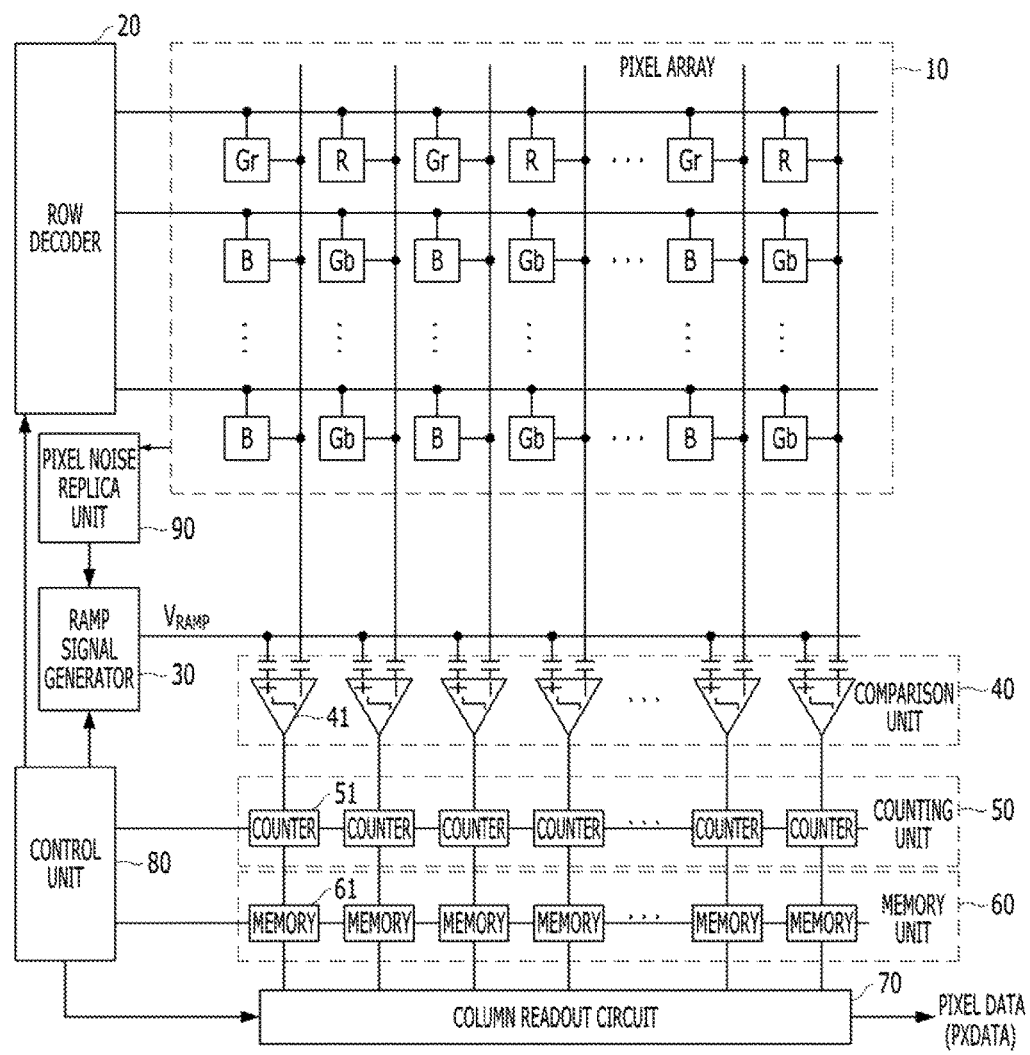
FIG. 1A is a diagram illustrating a CMOS image sensor according to a conventional embodiment.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. As used herein, singular forms are intended to include the plural forms as well, unless the context clearly indicates otherwise. It will be further understood that the terms "comprises," "comprising," "includes," "including," when used in this specification, specify the presence of the stated elements and do not preclude the presence or addition of one or more other elements.

Figure 1B:
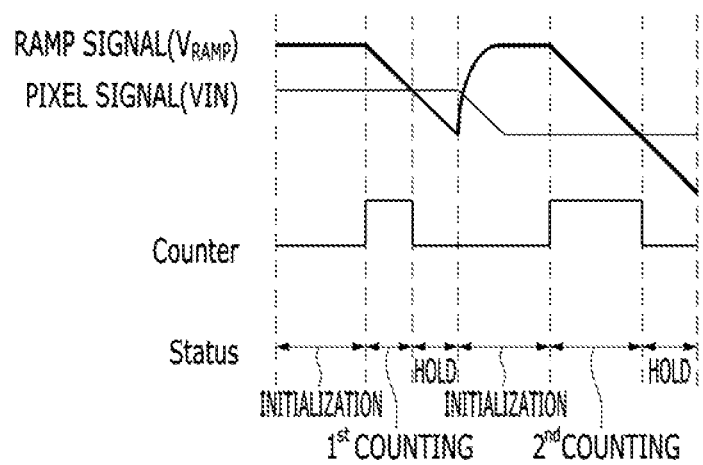
FIG. 1B is a timing diagram describing an analog-digital conversion method for the CMOS image sensor illustrated in FIG. 1A.

FIG. 1A is a diagram illustrating a CMOS image sensor (CIS) according to an embodiment. FIG. 1B is a timing diagram describing an analog-to-digital conversion method for the CMOS image sensor shown in FIG. 1A. The CMOS image sensor shown in FIG. 1A may have a column parallel structure with a typical single-slope analog-to-digital converter.

As shown in FIG. 1A, the CMOS Image sensor includes a pixel array 10, a row decoder 20, a pixel noise replica unit 90, a ramp signal generator 30, a comparison unit 40, a counting unit 50, a memory unit 60, a column readout circuit 70, and a control unit 80. The control unit 80 may include a timing generator.

The pixel array 10 may output a pixel signal corresponding to incident light. The row decoder 20 may select a pixel in the pixel array 10 at each row line, and control the operation of the selected pixel, under the control of the control unit 80. The pixel noise replica unit 90 may replicate noise of a pixel (hereinafter, referred to as a "pixel noise") in the pixel array 10. The ramp signal generator 30 may generate a ramp signal $V_{RAMP}$ on which the pixel noise provided from the pixel noise replica unit 90 is reflected, under the control of the control unit 80. The comparison unit 40 may compare a value of the ramp signal $V_{RAMP}$ with a value of each pixel signal outputted from the pixel array 10. The counting unit 50 may count a clock applied from the control unit 80 according to each comparison signal outputted from the comparison unit 40. The memory unit 60 may store counting information provided from the counting unit 50 under the control of the control unit 80. The column readout circuit 70 may successively output data of the memory unit 60 as pixel data PXDATA under the control of the control unit 80. The control unit 80 may control operations of the row decoder 20, the ramp signal generator 30, the counting unit 50, the memory unit 60, and the column readout circuit 70.

For example, the pixel noise replica unit 90 may receive the pixel noise in the pixel array 10, and apply the received pixel noise to a voltage source of the ramp signal generator 30. The ramp signal generator 30 may generate the ramp signal $V_{RAMP}$ in form of a voltage or current, by reflecting the pixel noise on the ramp signal $V_{RAMP}$, and apply the ramp signal $V_{RAMP}$ to the comparison unit 40.

The comparison unit 40 may include a plurality of comparators, the counting unit 50 may include a plurality of counters, and the memory unit 60 may include a plurality of memories. That is, a comparator, a counter, and a memory may be disposed at each column.

Referring to FIGS. 1A and 1B, operations of one comparator, one counter and one memory will be described as follows.

First, a first comparator 41 may receive a pixel signal outputted from a first column of the pixel array 10 through a first input terminal, receive the ramp signal $V_{RAMP}$ which is applied from the ramp signal generator 30 through a second input terminal, compare values of the two signals with each other, and output a comparison signal. The pixel noise included in the pixel signal may be offset by the ramp signal $V_{RAMP}$ on which the pixel noise is reflected.

Since the ramp signal $VR_{RAMP}$ has a voltage level which ramps-down with a predetermined rate as time elapses after an initialization operation, the values of two signals inputted to the first comparator 41 coincide with each other at a certain time point. From the coincidence time point, the value of the comparison signal outputted from the first comparator 41 may be inverted.

A first counter 51 may count the clock from the control unit 80 from when the ramp signal $V_{RAMP}$ begins to decrease to when the comparison signal outputted from the first comparator 41 is inverted, and output counting information. Each counter may be initialized in response to a reset signal from the control unit 80.

A first memory 61 may store the counting information from the counter 51 according to a load signal from the control unit 80, and output the stored counting information to the column readout circuit 70.

As illustrated in FIG. 1B, the CMOS image sensor may perform a first counting operation on the reset signal and perform a second counting operation on the image signal.

The above-described pixel noise cancellation method is capable of restricting pixel noises only when all pixel noises generated at the respective columns have the same phase and magnitude. However, since the pixel noises are randomly generated, the supposition that all pixel noises have the same phase and magnitude is different from the reality.

Thus, in the pixel noise cancellation method, phase-shifted pixel noise may worsen signal distortion between the ramp signal $V_{RAMP}$ applied from the ramp signal generator and the pixel signal applied from the pixel array, depending on each case.

The pixel noise cancellation method may partially cancel pixel noises by reflecting the average of the pixel noises on the ramp signal $V_{RAMP}$, but may not cancel actual pixel noises which are generated differently depending on positions in the respective columns.

Figure 2A:
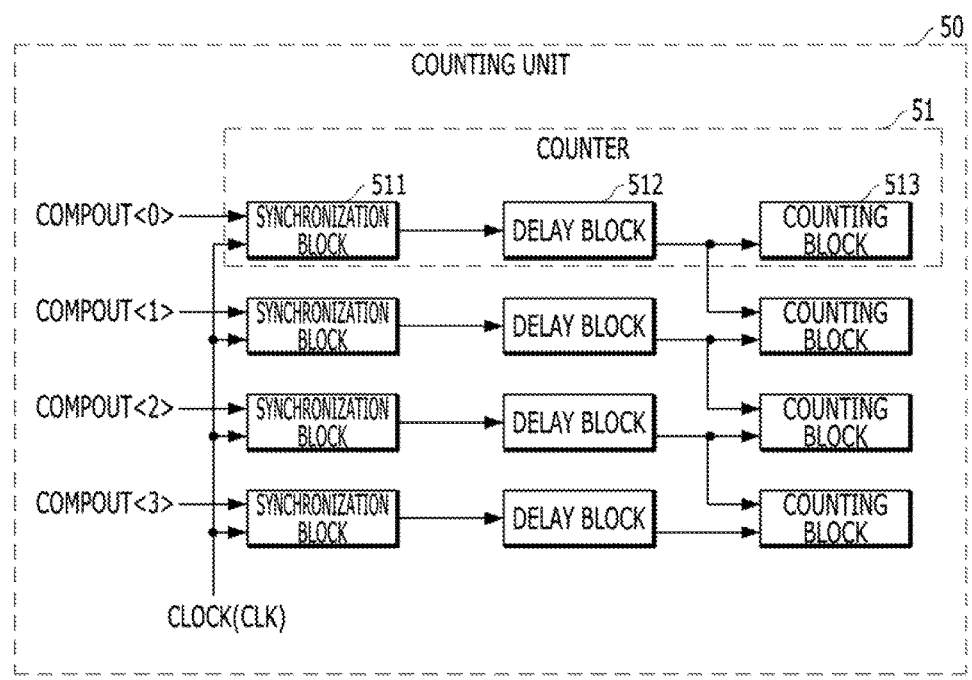
FIG. 2A is a block diagram illustrating a counting unit according to a conventional embodiment.

FIG. 2A is a block diagram illustrating a counting unit according to a conventional embodiment.

FIG. 2A illustrates an example of the counting unit 50 shown in FIG. 1A. Referring to FIG. 2A, the plurality of counters may be coupled to respective columns in the counting unit 50, and receive a corresponding one of comparison signals COMPOUT<0:3> outputted from the comparison unit (40 of FIG. 1A) and a clock CLK from the control unit (80 of FIG. 1A). In FIG. 2A, only first to fourth columns will be taken as an example for description.

Since the plurality of counters have substantially the same structure, the first counter 51 will be described as an example. The first counter 51 may include a synchronization block 511, a delay block 512 and a counting block 513.

The synchronization block 511 may receive the clock CLK and the comparison signal COMPOUT<0> outputted from the first comparator 41 of the first column, and synchronize the comparison signal COMPOUT<0> based on the clock. The synchronization block 511 may be embodied by a flip-flop.

The delay block 512 may receive an output signal from the synchronization block 511 and delay the output signal by a predetermined clock. For example, the delay block 512 may include at least one latch which delays the output signal of the synchronization block 511 by a predetermined clock.

The counting block 513 may receive and count an output signal of the delay block 512. An uppermost counting block, for example, the counting block 513 of the first counter 51, among the counting blocks of the counting unit 50 may count the output signal of the delay block 512, and each of the remaining counting blocks may count a difference between an output signal of the corresponding delay block and a signal inputted to an adjacent counting block.

Figure 2B:
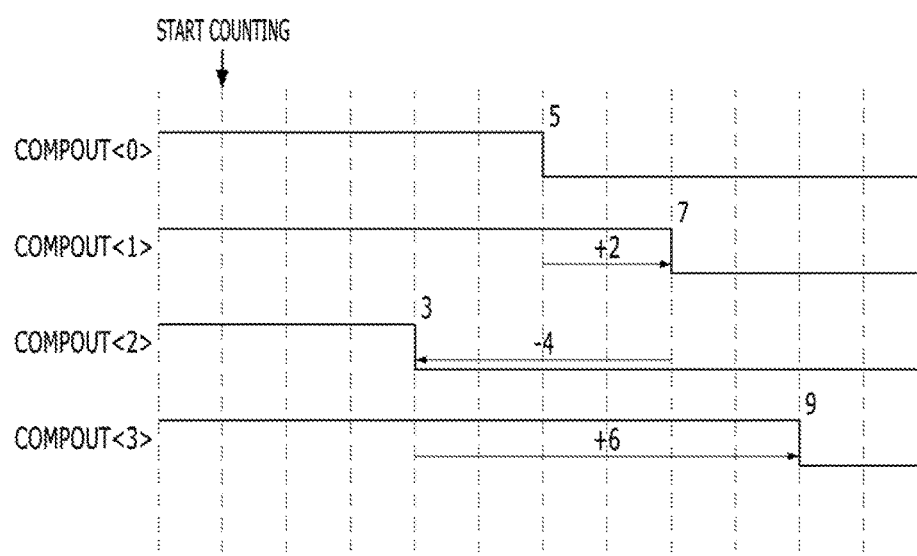
FIG. 2B is a timing diagram illustrating a counting operation of the counting unit, according to a conventional embodiment.

FIG. 2B is a timing diagram illustrating a counting operation of the counting unit 50, according to a conventional embodiment.

Referring to FIG. 2B, the counting unit 50 may perform the counting operation using a data value difference between two adjacent columns. For example, data values of the comparison signals COMPOUT<0:3> of the first to fourth columns may correspond to 5, 7, 3 and 9, respectively, when the counting is performed by the conventional counter. In the case of a conventional embodiment, when the comparison signal COMPOUT<0> of the first column is read and a data value difference between two adjacent columns is read for each of the second to fourth columns, data values counted by the counters from the first column to the fourth column may be 5, 2, −4 and 6. This is due to a data value difference between adjacent columns read after one column is read.

Furthermore, referring to FIG. 2B, when the comparison signals COMPOUT<0> to COMPOUT<3> inputted to the respective counters of the first to fourth columns are counted, the data values may be 5, 7, 3 and 9, respectively. Although a conventional counting block counts the data as it is, the counting block in accordance with an embodiment of the present disclosure may count only data of one column, for example, the first column, and count only a data value difference between two adjacent columns using an XOR operation. Here, the sign of the counted value may be set to plus (+) when the data value of the corresponding column is greater than the data value of the adjacent preceding column, or minus (−) when the data value of the corresponding column is less than the data value of the adjacent preceding column.

For instance, after the data of the first column is counted, the data value "+2" of the second column may be obtained by performing an XOR operation on the comparison signal COMPOUT<0> of the first column and the comparison signal COMPOUT<1> of the second column.

The data value "−4" of the third column may be obtained by performing an XOR operation on the comparison signal COMPOUT<1> of the second column and the comparison signal COMPOUT<2> of the third column.

The data value "+6" of the fourth column may be obtained by performing an XOR operation on the comparison signal COMPOUT<2> of the third column and the comparison signal COMPOUT<3> of the fourth column.

The above-described counting method using a data value difference may reduce counting power consumption by reducing the number of counting operations, but a data conversion time may not be shortened. Therefore, data may not be processed at high speed, and standby power consumption of the synchronization block may not be reduced. The reason that the data conversion time may not be shortened will be described in more detail. For example, when a difference value between the two pixel signals is counted, suppose that the number of counting operations for a first pixel signal is 500 and the number of counting operations for a second pixel signal is 600. In this case, a counting method in accordance with an embodiment of the present disclosure, which will be described below, may count only a difference value between two pixel signals, but the above-described counting method using a data value difference may perform 100 counting operations after performing 500 counting operations. That is, according to the above-described counting method using a data value difference, the counting block may not be operated before the two pixel signals from adjacent pixels are outputted, but perform the next counting operation after one pixel signal among two pixel signals from adjacent pixels is outputted. Hence, the above-described counting method may reduce power consumption only while no counting operations are performed, but the entire operation time may not be shortened.

Therefore, various embodiments of the present disclosure are directed to canceling noise caused when a pixel signal is extracted, increasing data processing speed and minimizing standby power consumption by reducing a data conversion time, and reducing counter power consumption by reducing the number of counting operations. Hereinbelow, various embodiments will be described in detail with reference to FIGS. 3 to 6D.

Figure 3:
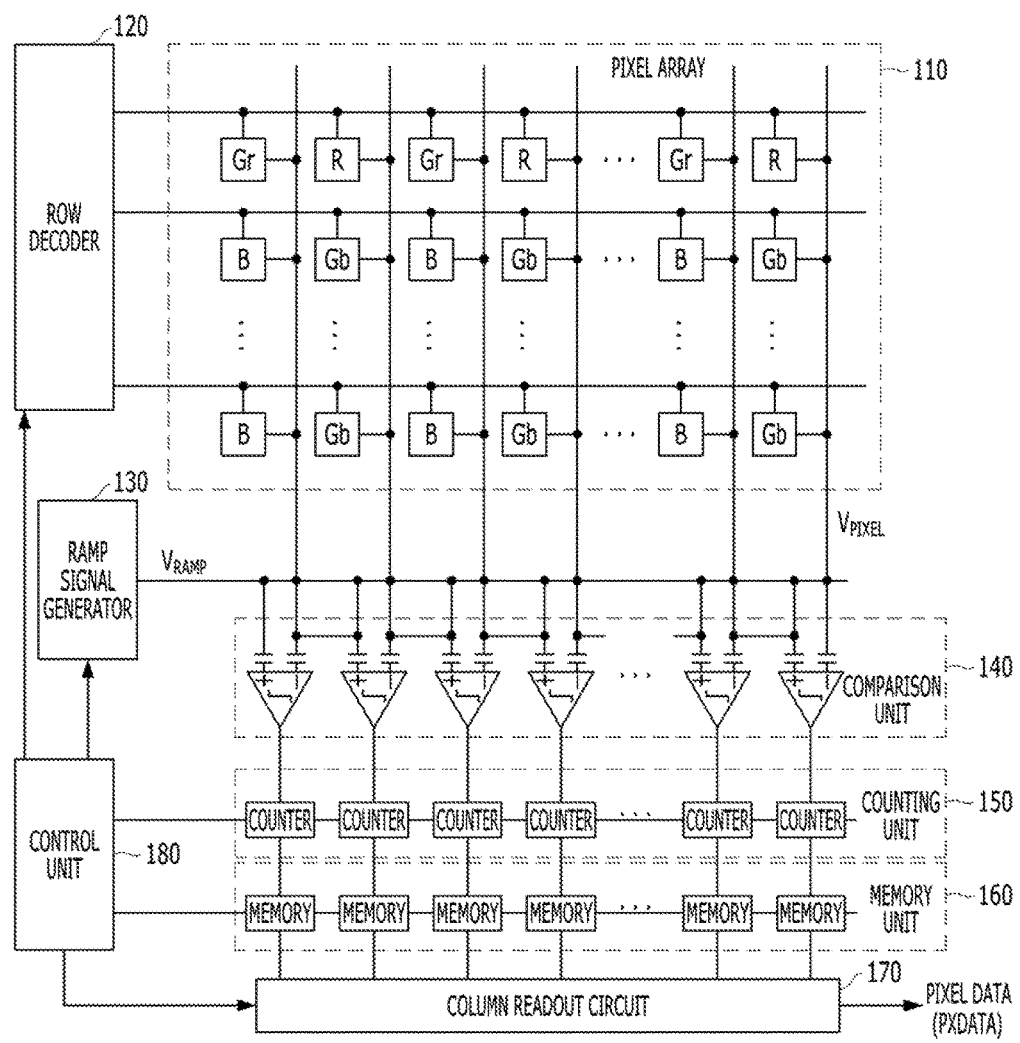
FIG. 3 is a diagram illustrating a CMOS image sensor in accordance with an embodiment of the present invention.

FIG. 3 is a diagram illustrating a CMOS image sensor in accordance with an embodiment of the present invention.

As shown in FIG. 3, the CIS in accordance with the embodiment includes a pixel array 110, a row decoder 120, a ramp signal generator 130, a comparison unit 140, a counting unit 150, a memory unit 160, a control unit 180, and a column readout circuit 170. The control unit 180 may include a timing generator.

The pixel array 110 may output a pixel signal $V_{PIXEL}$ corresponding to incident light. The row decoder 120 may select a pixel in the pixel array 110 at each row line and control the operation of the selected pixel, under the control of the control unit 180. The ramp signal generator 130 may generate a ramp signal $V_{RAMP}$ under the control of the control unit 180. The comparison unit 140 may determine a magnitude between adjacent pixel signals, that is, a pixel signal of a corresponding column to be currently compared (hereinafter, referred to as a "comparison column") and a pixel signal of an adjacent column adjacent to the comparison column, outputted from the pixel array 110 using a reference signal, select a ramp signal applied from the ramp signal generator 130 to a first CDS block or a ramp signal applied to a second CDS block depending on a result of the determination, and compare the selected ramp signal with a difference value between the adjacent pixel signals. The counting unit 150 may count a clock applied from the control unit 180 according to each comparison signal outputted from the comparison unit 140. The memory unit 160 may store the counting information provided from the counting unit 150 under the control of the control unit 180. The column readout circuit 170 may successively output data of the memory unit 160 as pixel data PXDATA under the control of the control unit 180. The control unit 180 may control operations of the row decoder 120, the ramp signal generator 130, the counting unit 150, the memory unit 160, and the column readout circuit 170.

The comparison unit 140 may include a plurality of comparators, the counting unit 150 may include a plurality of counters, and the memory unit 160 may include a plurality of memories. That is, a comparator, a counter and a memory may be disposed at each column.

Hereinafter, operations of one comparator, one counter, and one memory will be described by way of example.

First, a comparator of a reference column may receive a pixel signal outputted from a corresponding column of the pixel array 110 through a first input terminal, receive an initial set ramp signal applied from the ramp signal generator 130 through a second input terminal, and output an initial comparison signal by comparing the values of the two signals. The initial set ramp signal may be the ramp signal applied to the first CDS block or the ramp signal applied to the second CDS block. Since the comparator of the reference column is well known, the detailed descriptions thereof are omitted herein. The reference column may correspond to the first or last column, or both of the first and last columns.

The comparator disposed in each of the columns except for the reference column may receive a pixel signal outputted from the comparison column through a first input terminal and receive a pixel signal outputted from the adjacent column through a second input terminal, and determine a magnitude between the adjacent pixel signals outputted from the pixel array 110 using the reference signal to output switch control signals. The comparator may select the ramp signal applied from the ramp signal generator 130 to the first CDS block or the ramp signal applied to the second CDS block according to the switch control signals, compare the selected ramp signal with the difference value between the adjacent pixel signals, and then output the comparison signal.

Accordingly, the counter of the comparison column may count the clock applied from the control unit 180 from when the ramp signal $V_{RAMP}$ begins to increase or decrease to when the comparison signal outputted from the comparator is inverted, and output the counting information. Each counter may be initialized in response to a reset signal from the control unit 180.

The memory of the comparison column may store the counting information applied from the counter according to a load signal from the control unit 180, and output the stored counting information to the column readout circuit 170.

Figure 4A:
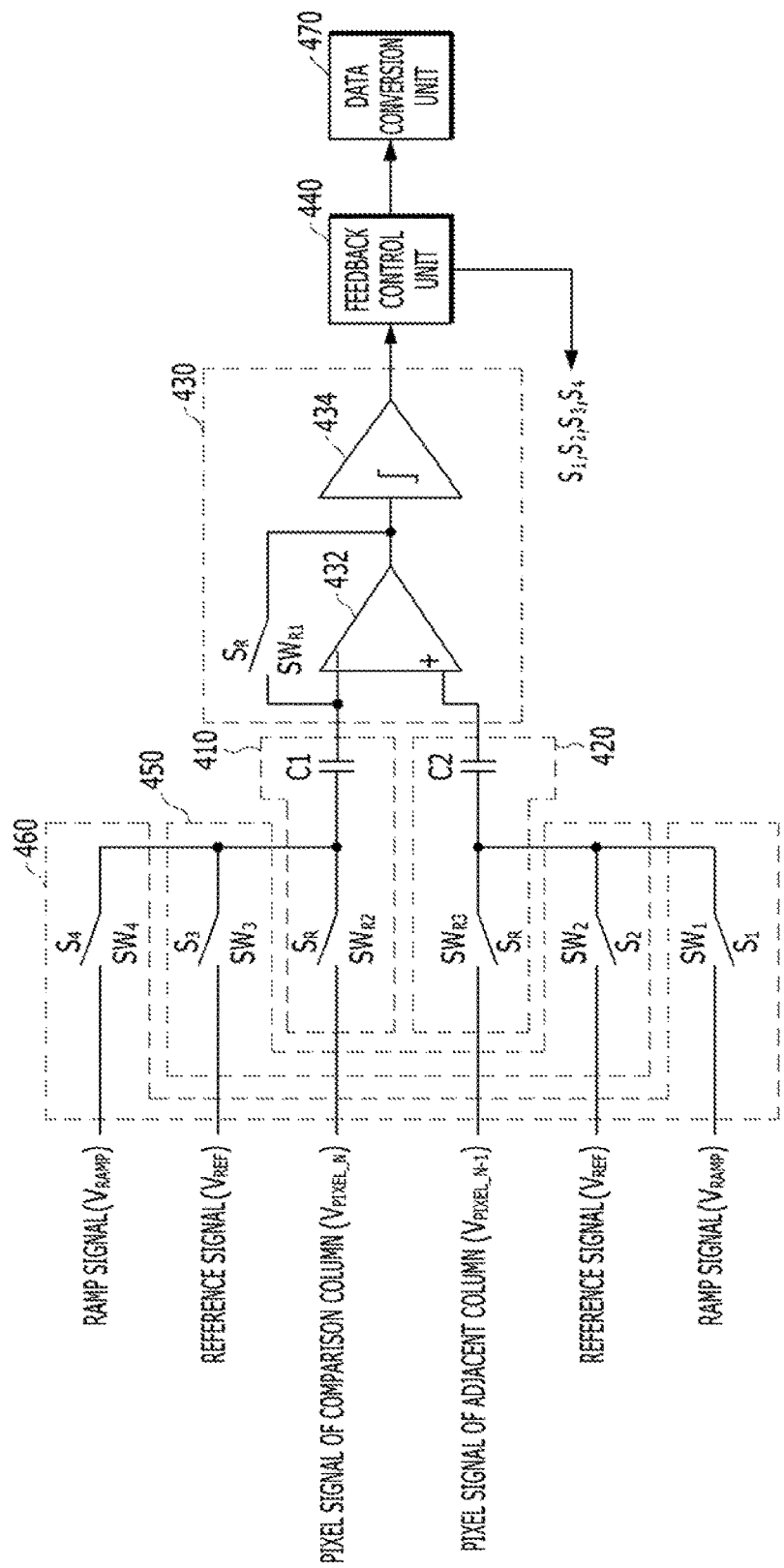
FIG. 4A is a block diagram illustrating an analog-to-digital converter in accordance with an embodiment of the present invention.
Figure 4B:
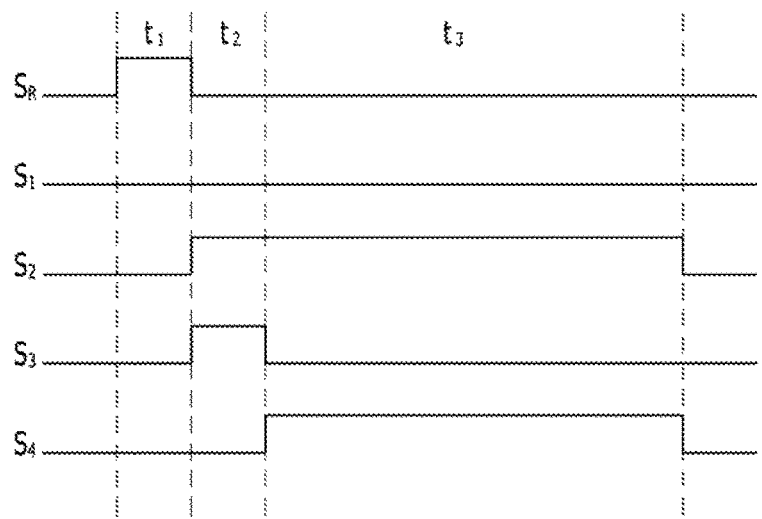
FIGS. 4B and 4C are timing diagrams illustrating switch control signals for the analog-to-digital converter shown in FIG. 4A.
Figure 4C:
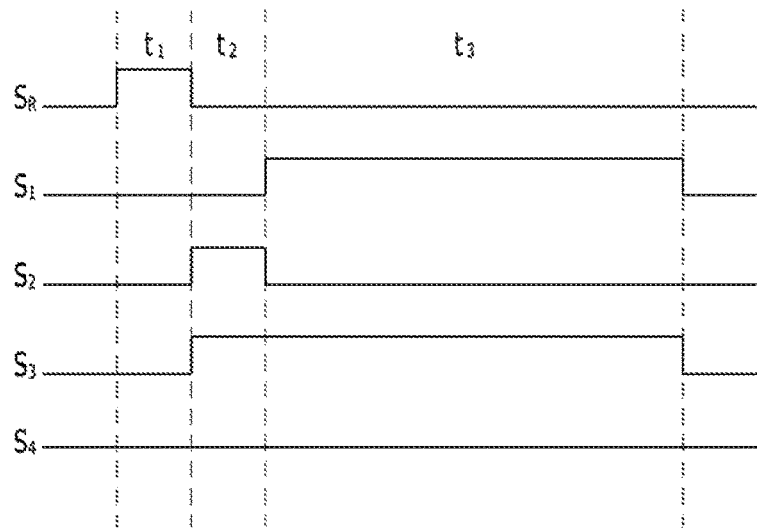
Figure 4D:
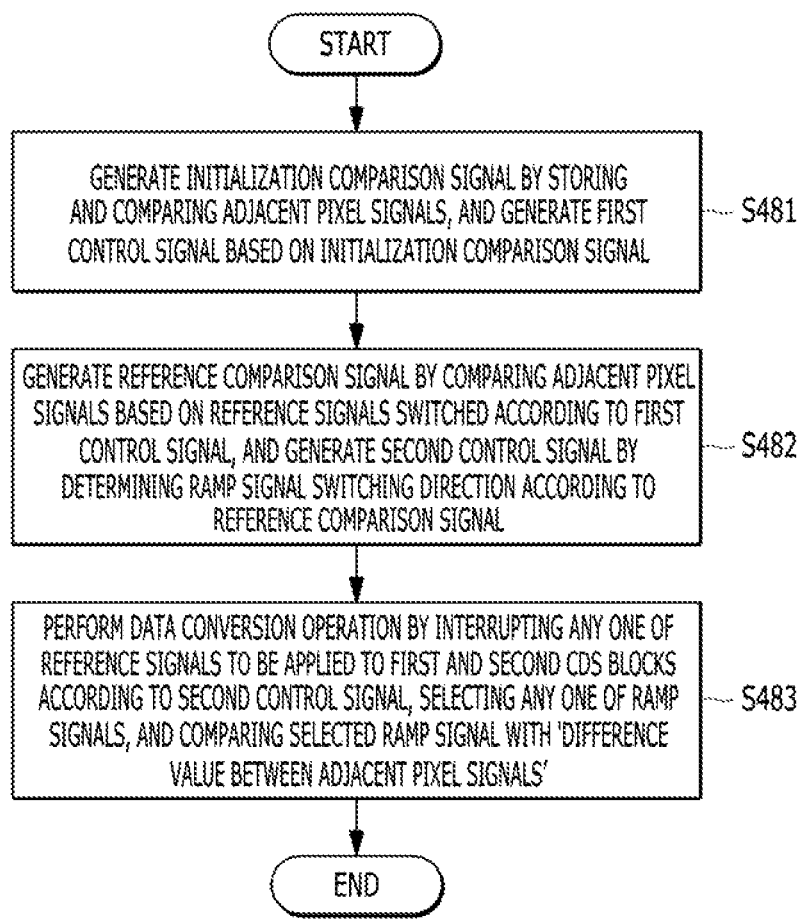
FIG. 4D is a flowchart illustrating an analog-to-digital conversion method for the analog-to-digital converter shown in FIG. 4A.

FIG. 4A is a block diagram illustrating an analog-to-digital converter in accordance with an embodiment of the present invention, FIGS. 4B and 4C are timing diagrams illustrating the switch control signals for the analog-to-digital converter of FIG. 4A, and FIG. 4D is a flowchart of an analog-to-digital conversion method for the analog-to-digital converter of FIG. 4A.

FIG. 4A illustrates an analog-to-digital converter which is positioned at each column except for the reference column, FIG. 4B illustrates a timing diagram of the switch control signals when a value of a pixel signal of a comparison column is greater than a value of a pixel signal of an adjacent column, and FIG. 4C illustrates a timing diagram of the switch control signals when a value of a pixel signal of a comparison column is less than or equal to a value of a pixel signal of an adjacent column.

As illustrated in FIG. 4A, the analog-to-digital converter in accordance with the present embodiment may include a first CDS block 410, a second CDS block 420, a comparison block 430, a feedback control unit 440, a reference signal switching block 450, a ramp signal select block 460, and a data conversion unit 470.

The first CDS block 410 may receive and store a pixel signal $V_{PIXEL\_N}$ of a comparison column and perform CDS. The second CDS block 420 may receive and store a pixel signal $V_{PIXEL\_N-1}$ of an adjacent column and perform CDS.

The comparison block 430 may compare the pixel signal $V_{PIXEL\_N}$ stored in the first CDS block 410 with the pixel signal $V_{PIXEL\_N-1}$ stored in the second CDS block 420 (hereinafter, the two pixel signals will be referred to in common as "adjacent pixel signals"), and generate an initial comparison signal. The comparison block 430 may generate a reference comparison signal by comparing the adjacent pixel signals based on a reference signal $V_{REF}$ inputted through the first and second CDS blocks 410 and 420, and compare any one signal selected from ramp signals applied to the first and second CDS blocks 410 and 420 with the difference value between the adjacent pixel signals.

The feedback control unit 440 may output a first control signal including second and third switch control signals $S_2$ and $S_3$ for controlling second and third switches $SW_2$ and $SW_3$, according to the initial comparison signal provided from the comparison block 430, determine a ramp signal switching direction according to the reference comparison signal from the comparison block 430, and output a second control signal including first and fourth switch control signals $S_1$ and $S_4$ for controlling first and fourth switches $SW_1$ and $SW_4$. When the pixel signal of the comparison column is greater than the pixel signal of the adjacent column, the feedback control unit 440 may generate the fourth switch control signal $S_4$ for turning on the fourth switch $SW_4$ as shown in FIG. 4B. When the pixel signal of the comparison column is less than or equal to the pixel signal of the adjacent column, the feedback control unit 440 may generate the first switch control signal $S_1$ for turning on the first switch $SW_1$ as shown in FIG. 4C.

The reference signal switching block 450 may switch the reference signal $V_{REF}$ to be applied to the first and second CDS blocks 410 and 420 according to the first control signal provided from the feedback control unit 440. The ramp signal select block 460 may select a ramp signal $V_{RAMP}$ to be applied to the first or second CDS block 410 or 420 according to the second control signal provided from the feedback control unit 440. The data conversion unit 470 may perform a data conversion operation according to a comparison signal of the comparison block 430. Here, the ramp signal generator 130 described with reference to FIG. 3 may generate the ramp signal $V_{RAMP}$ and apply it to the ramp signal select block 460 under the control of the control unit 180. The reference signal switch block 450 may receive the reference signal $V_{REF}$ from an external reference signal generator (not shown).

The analog-to-digital converter shown in FIG. 4A may store adjacent pixel signals and generate an initial comparison signal by comparing the adjacent pixel signals, generate a first control signal according to the initial comparison signal, generate a reference comparison signal by comparing the adjacent pixel signals based on reference signals switched according to the first control signal, determine a ramp signal switching direction according to the reference comparison signal and generate a second control signal, and perform a data conversion operation by interrupting any one of the reference signals to be applied to the first and second CDS blocks 410 and 420 according to the second control signal, selecting any one ramp signal to be applied to the first or second CDS block 410 or 420, comparing the selected ramp signal with a difference value between the adjacent pixel signals.

For example, the comparison block 430 may be embodied using a comparator 432, a switch $SW_{R1}$ and an amplifier 434. According to an embodiment, the comparison block 430 may be embodied using a comparator and a switch. The first CDS block 410 may be embodied using a switch $SW_{R2}$ and a first capacitor C1, and the second CDS block 420 may be embodied using a switch $SW_{R3}$ and a second capacitor C2. The switches $SW_{R1}$ to $SW_{R3}$ are turned on in response to an initial control signal $S_R$ provided from the control unit 180. The reference signal switching block 450 may be embodied using the second switch $SW_2$ and the third switch $SW_3$. The ramp signal select block 460 may be embodied using the first switch $SW_1$ and the fourth switch $SW_4$.

The data conversion unit 470 may directly receive the comparison signal of the comparison block 430 or receive the comparison signal through the feedback control unit 440 as illustrated in FIG. 4A. The data conversion unit 470 may include a counter and a memory. When the data conversion operation is completed, the corresponding block may be disabled to reduce standby power.

Referring to FIGS. 4A to 4D, an operation of the analog-to-digital converter will be described as follows.

First, the analog-to-digital converter may store adjacent pixel signals, generate an initial comparison signal by comparing the adjacent pixel signals, and generate a first control signal according to the initial comparison signal, at step S481. That is, the analog-to-digital converter may receive and store the adjacent pixel signals, compare the two signals, and generate the initial comparison signal, at an initial stage. The analog-to-digital converter may generate the first control signal for switching the reference signals according to the Initial comparison signal. More specifically, during a period $t_1$, the switches $SW_{R1}$ to $SW_{R3}$ may be turned on, and the first to fourth switches $SW_1$ to $SW_4$ may be turned off. For instance, as the switches $SW_{R1}$ to $SW_{R3}$ are turned on under the control of the control unit 180, the pixel signal of the comparison column may be inputted so as to be stored in the first capacitor C1. In addition, as the switches $SW_{R1}$ to $SW_{R3}$ are turned on, the pixel signal of the adjacent column may be Inputted so as to be stored in the second capacitor C2. The comparison block 430 may compare the adjacent pixel signals with each other and output the initial comparison signal to the feedback control unit 440. The feedback control unit 440 may generate the first control signal according to the initial comparison signal generated from the comparison block 430 and output the first control signal to the reference signal switching block 450. That is, the feedback control unit 440 may generate the first control signal including the second and third switch control signals $S_2$ and $S_3$ for controlling the second and third switches $SW_2$ and $SW_3$.

Thereafter, the analog-to-digital converter may generate a reference comparison signal by comparing the adjacent pixel signals based on the reference signals switched according to the first control signal, and generate a second control signal by determining a ramp signal switching direction according to the reference comparison signal, at step S482. That is, the analog-to-digital converter may switch the reference signals according to the first control signal. Thereby, when the previously stored adjacent pixel signals are changed according to the inputted reference signals, the analog-to-digital converter may compare the changed adjacent pixel signals with each other and generate the reference comparison signal.

As a result of the comparison in magnitudes of the adjacent pixel signals using the reference comparison signal, when the pixel signal of the comparison column is greater in voltage level than the pixel signal of the adjacent column, the ramp signal switching direction may be determined to the first CDS block 410. In this case, the analog-to-digital converter may select a ramp signal to be applied to the first CDS block 410, and generate the second control signal for interrupting the reference signal to be applied to the first CDS block 410. When the pixel signal of the comparison column is less in voltage level than or equal to the pixel signal of the adjacent column, the ramp signal switching direction is determined to the second CDS block 420. In this case, the analog-to-digital converter may select a ramp signal to be applied to the second CDS block 420, and generate the second control signal for interrupting the reference signal to be applied to the second CDS block 420.

In more detail, during a period $t_2$, the switches $SW_{R1}$ to $SW_{R3}$ may be turned off, and the second and third switches $SW_2$ and $SW_3$ are turned on according to the first control signal. As the third switch $SW_3$ is turned on, the corresponding reference signal may be inputted to the first capacitor C1 to change the pixel signal of the comparison column that has been stored in the first capacitor C1. As the second switch $S_2$ is turned on, the corresponding reference signal may be inputted to the second capacitor C2 to change the pixel signal of the adjacent column that has been stored in the second capacitor C2. The comparison block 430 may compare the changed adjacent pixel signals with each other and output the reference comparison signal to the feedback control unit 440. The feedback control unit 440 may compare the magnitudes of the adjacent pixel signals using the reference comparison signal. As a result of the comparison, when the pixel signal of the comparison column is greater in voltage level than the pixel signal of the adjacent column, the feedback control unit 440 may determine the ramp signal switching direction to the first CDS block 410, so that the fourth switch control signal $S_4$ for selecting the ramp signal to be applied to the first CDS block 410 may be generated, and the third switch control signal $S_3$ for turning off the third switch $S_3$ for transferring the reference signal to the first CDS block 410 may be generated. When the pixel signal of the comparison column is less than or equal to the pixel signal of the adjacent column, the feedback control unit 440 may determine the ramp signal switching direction to the second CDS block 420, so that the first switch control signal $S_1$ for selecting the ramp signal to be applied to the second CDS block 420 may be generated, and the second switch control signal $S_2$ for turning off the second switch $S_2$ for transferring the reference signal to the second CDS block 420 may be generated. That is, the feedback control unit 440 may generate the second control signal including the first and fourth switch control signals $S_1$ and $S_4$.

Subsequently, according to the second control signal, the analog-to-digital converter may perform a data conversion operation by interrupting any one of the reference signals to be applied to the first and second CDS blocks 410 and 420, selecting any one ramp signal to be applied to the first or second CDS block 410 or 420, and comparing the selected ramp signal with the difference value between the adjacent pixel signals, at step S483. That is, according to the second control signal for controlling the reference signal to be applied to the second CDS block 420 and the ramp signal to be applied to the first CDS block 410, the analog-to-digital converter may perform a data conversion operation by interrupting the reference signal to be applied to the first CDS block 410, selecting the ramp signal to be applied to the first CDS block 410, and comparing the selected ramp signal with the difference value between the adjacent pixel signals. Alternatively, according to the second control signal for controlling the reference signal to be applied to the first CDS block 410 and the ramp signal to be applied to the second CDS block 420, the analog-to-digital converter may perform a data conversion operation by interrupting the reference signal to be applied to the second CDS block 420, selecting the ramp signal to be applied to the second CDS block 420, and comparing the selected ramp signal with the difference value between the adjacent pixel signals.

More specifically, referring to FIG. 4B, during a period $t_3$, the third and fourth switch control signals $S_3$ and $S_4$ for interrupting the reference signal to be applied to the first CDS block 410 and selecting the ramp signal to be applied to the first CDS block 410 are generated. Thus, the third switch $S_3$ may be turned off in response to the third switch control signal $S_3$ to interrupt the corresponding reference signal to be applied to the first CDS block 410. At this time, the second switch $S_2$ maintains a turned-on state so that the associated reference signal is continuously applied to the second CDS block 420. The fourth switch $S_4$ may be turned on in response to the fourth switch control signal $S_4$ so that the corresponding ramp signal is inputted to the first CDS block 410. The comparison block 430 may compare the difference value between the adjacent pixel signals with the ramp signal applied through the first CDS block 410, and output a comparison signal. Hence, the data conversion unit 470 may perform a data conversion operation in response to the comparison signal.

Referring to FIG. 4C, during a period $t_3$, the first and second switch control signals $S_1$ and $S_2$ for interrupting the reference signal to be applied to the second CDS block 420 and selecting the ramp signal to be applied to the second CDS block 420 are generated. Thus, the second switch $S_2$ may be turned off in response to the second switch control signal $S_2$ to interrupt the corresponding reference signal to be applied to the second CDS block 420. At this time, the third switch $S_3$ maintains a turned-on state so that the associated reference signal is continuously applied to the first CDS block 410. The first switch $SW_1$ may be turned on in response to the first switch control signal $S_1$ so that the corresponding ramp signal is inputted to the second CDS block 420. The comparison block 430 may compare the difference value between the adjacent pixel signals with the ramp signal applied through the second CDS block 420, and output a comparison signal. Hence, the data conversion unit 470 may perform a data conversion operation in response to the comparison signal.

Figure 5:
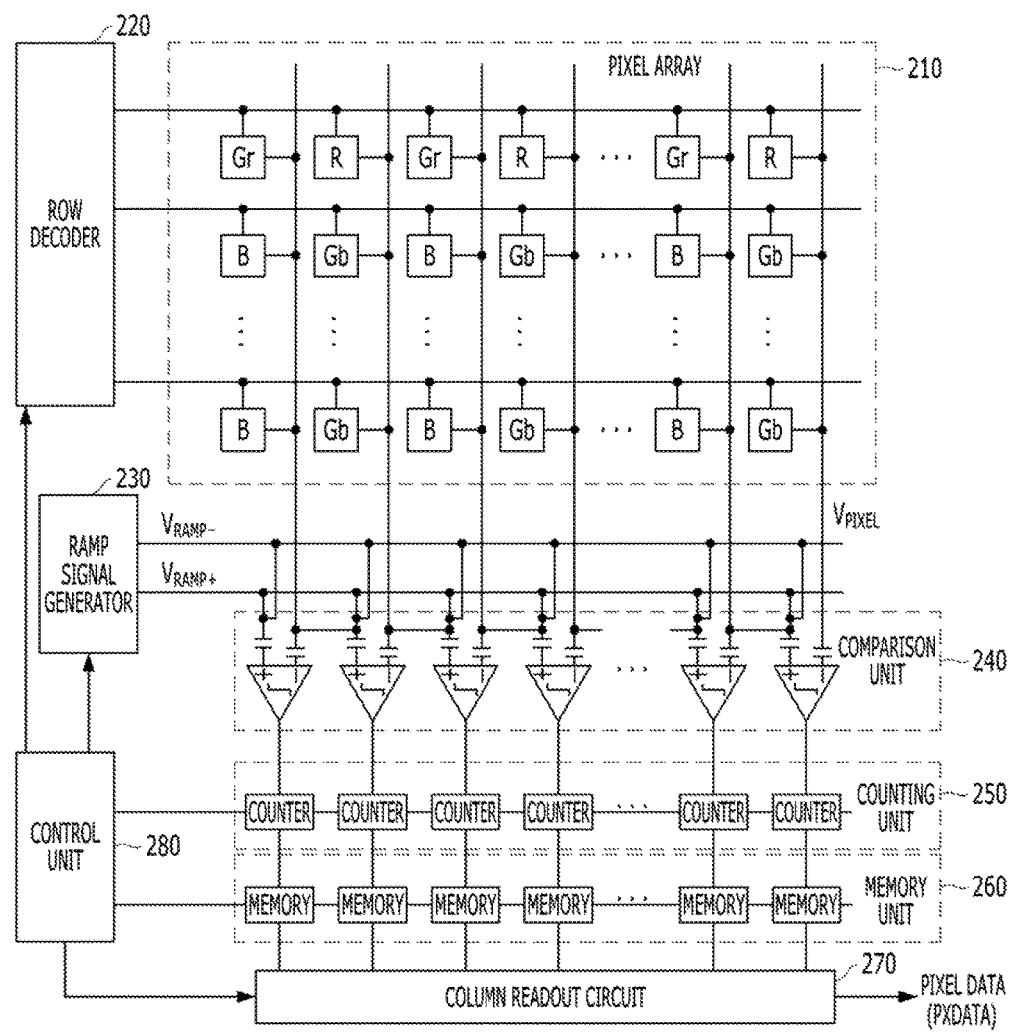
FIG. 5 is a diagram illustrating a CMOS image sensor in accordance with an embodiment of the present invention.

FIG. 5 is a diagram illustrating a CMOS image sensor in accordance with an embodiment of the present invention.

As shown in FIG. 5, the CMOS image sensor in accordance with the present embodiment includes a pixel array 210, a row decoder 220, a ramp signal generator 230, a comparison unit 240, a counting unit 250, a memory unit 260, a column readout circuit 270, and a control unit 280. The control unit 280 may include a timing generator.

The pixel array 210 may output a pixel signal $V_{PIXEL}$ corresponding to incident light. The row decoder 220 may select a pixel in the pixel array 210 at each row line and control the operation of the pixel under the control of the control unit 280. The ramp signal generator 230 may generate a ramp-up signal $V_{RAMP+}$ or a ramp-down signal $V_{RAMP-}$ under the control of the control unit 280. The comparison unit 240 may determine a magnitude between adjacent pixel signals outputted from the pixel array 210 using a reference signal, select one of the ramp-up signal $V_{RAMP+}$ and the ramp-down signal $V_{RAMP-}$ applied from ramp signal generator 230 according to a result of the determination, and compare the selected ramp signal with a difference value between the adjacent pixel signals outputted from the pixel array 210. The counting unit 250 may count a clock applied from the control unit 280 according to each comparison signal outputted from the comparison unit 240. The memory unit 260 may store counting information provided from the counting unit 250 under the control of the control unit 280. The column readout circuit 270 may successively output data of the memory unit 260 as pixel data PXDATA under the control of the control unit 280. The control unit 280 may control operations of the row decoder 220, the ramp signal generator 230, the counting unit 250, the memory unit 260, and the column readout circuit 270.

The comparison unit 240 may include a plurality of comparators, the counting unit 250 may include a plurality of counters, and the memory unit 260 may include a plurality of memories. That is, a comparator, a counter and a memory may be disposed at each column.

Hereinafter, operations of one comparator, one counter, and one memory will be described by way of example.

First, a comparator of a reference column may receive a pixel signal outputted from a corresponding column of the pixel array 210 through a first input terminal, receive an initial set ramp-up or ramp-down signal applied from the ramp signal generator 230 through a second input terminal, and output an initial comparison signal by comparing the values of the two signals. Since the comparator of the reference column is well known, the detailed descriptions thereof are omitted herein. The reference column may correspond to the first or last column, or both of the first and last columns.

The comparator disposed in each of the columns except for the reference column may receive a pixel signal outputted from a corresponding column to be currently compared hereinafter, referred to as a "a comparison column", through a first input terminal and receive a pixel signal outputted from an adjacent column adjacent to the comparison column through a second Input terminal, and determine a magnitude between the adjacent pixel signals outputted from the pixel array 210 using the reference signal to output switch control signals. The comparator may select one of the ramp-up signal and the ramp-down signal applied from the ramp signal generator 230 according to the switch control signals, compare the selected ramp signal with the difference value between the adjacent pixel signals, and then output the comparison signal.

Accordingly, the counter of the comparison column may count the clock applied from the control unit 280 from when the selected ramp signal begins to increase or decrease to when the comparison signal outputted from the comparator is inverted, and output the counting information. Each counter may be initialized in response to a reset signal from the control unit 280.

Then, the memory of the comparison column may store the counting information applied from the counter according to a load signal from the control unit 280, and output the stored counting information to the column readout circuit 270.

Figure 6A:
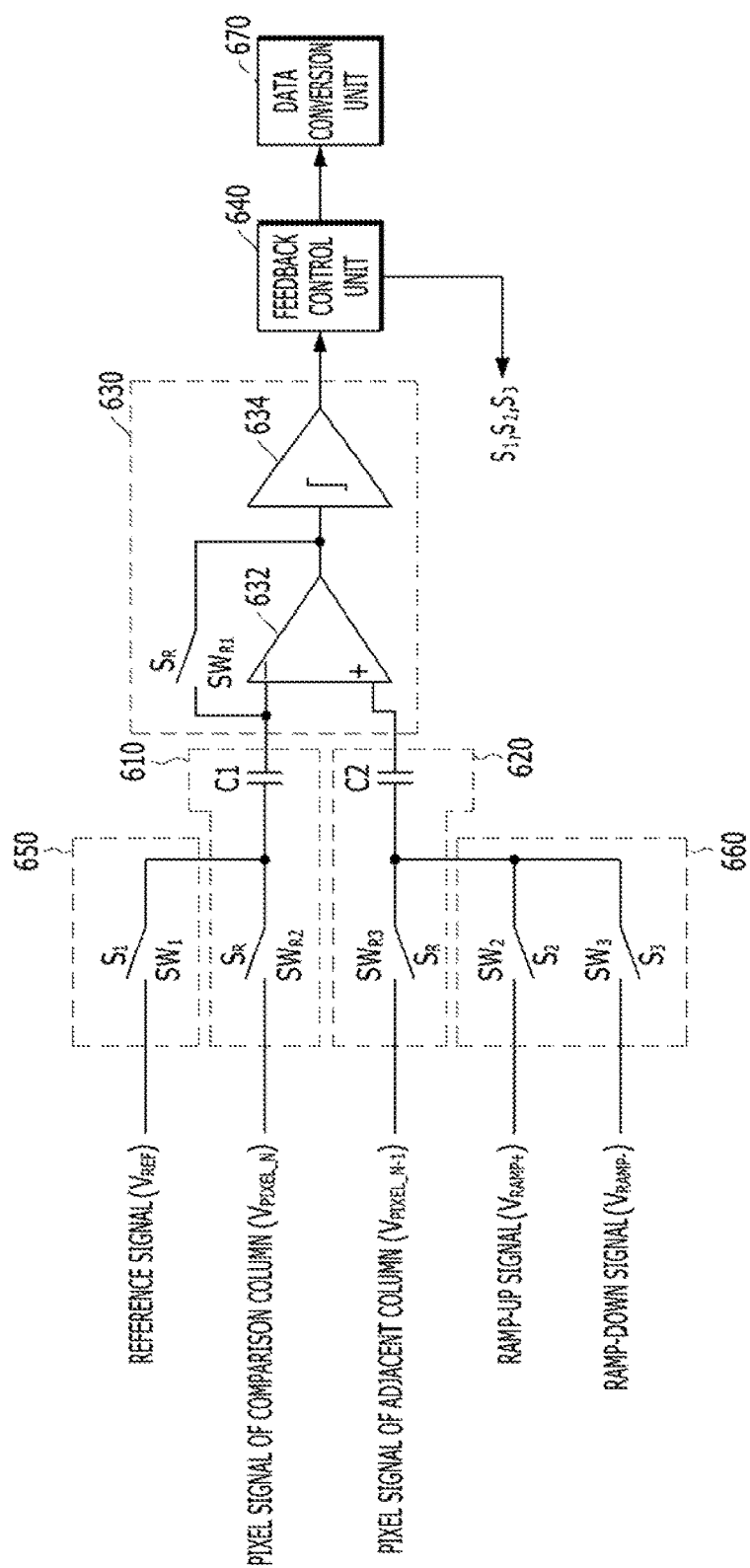
FIG. 6A is a block diagram illustrating an analog-to-digital converter in accordance with an embodiment of the present invention.
Figure 6B:
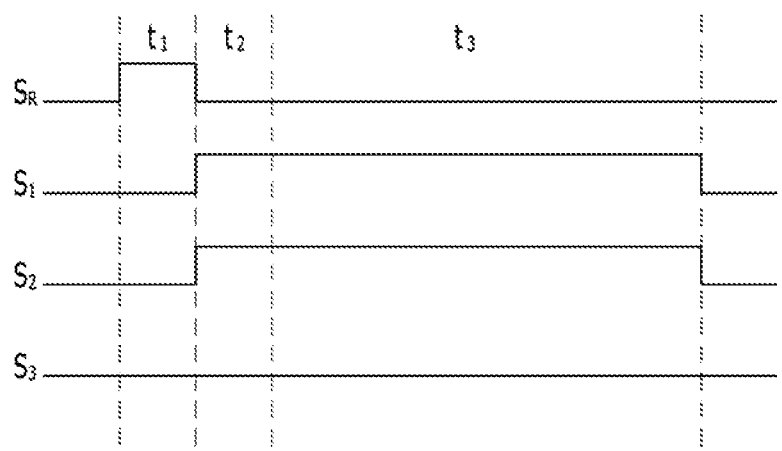
FIGS. 6B and 6C are timing diagrams Illustrating switch control signals for the analog-to-digital converter shown in FIG. 6A.
Figure 6C:
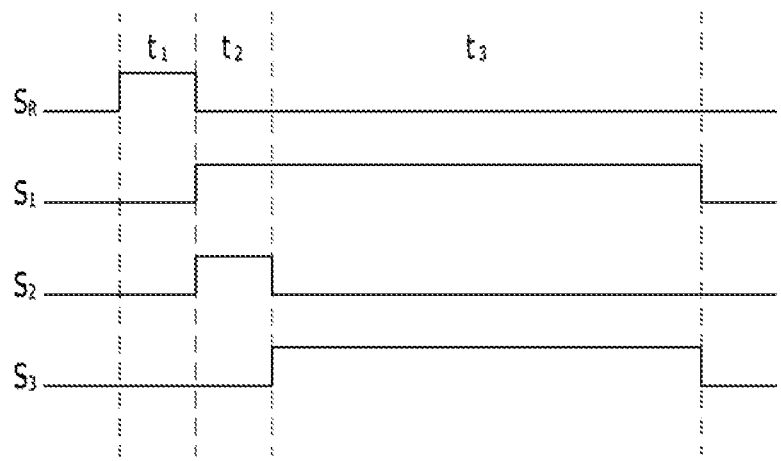
Figure 6D:
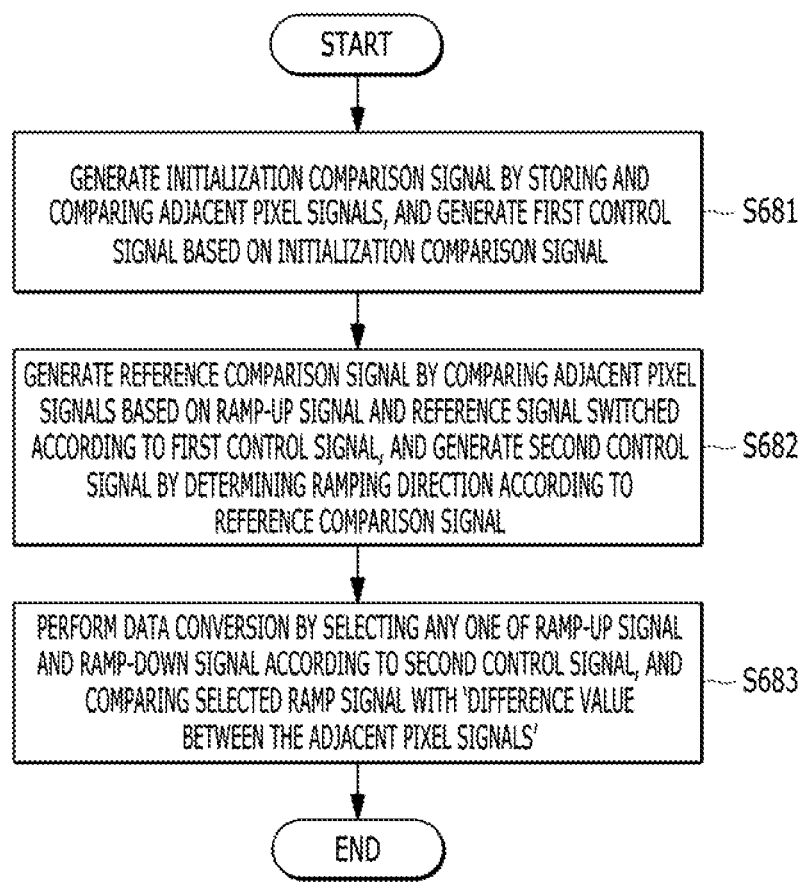
FIG. 6D is a flowchart illustrating an analog-to-digital conversion method of the analog-to-digital converter shown in FIG. 6A.

FIG. 6A is a block diagram Illustrating an analog-to-digital converter in accordance with an embodiment of the present invention, FIGS. 6B and 6C are timing diagrams illustrating the switch control signals for the analog-to-digital converter of FIG. 6A, and FIG. 6D is a flowchart of an analog-to-digital conversion method for the analog-to-digital converter of FIG. 6A.

FIG. 6A illustrates an analog-to-digital converter which is positioned at each column except for the reference column, FIG. 6B shows a timing diagram of the switch control signals when a value of a pixel signal of a comparison column is greater than a value of a pixel signal of an adjacent column, and FIG. 6C shows a timing diagram of the switch control signals when a value of a pixel signal of a comparison column is less than or equal to a value of a pixel signal of an adjacent column.

As illustrated in FIG. 6A, the analog-to-digital converter in accordance with the present embodiment may include a first CDS block 610, a second CDS block 620, a comparison block 630, a feedback control unit 640, a reference signal switching block 650, a ramp signal select block 660, and a data conversion unit 670.

The first CDS block 610 may receive and store a pixel signal $V_{PIXEL\_N}$ of a comparison column and perform CDS. The second CDS block 620 may receive and store a pixel signal $V_{PIXEL\_N-1}$ of an adjacent column and perform CDS. The comparison block 630 may compare adjacent pixel signals provided from the first and second CDS blocks 610 and 620 and generate an initial comparison signal. The comparison block 630 may generate a reference comparison signal by comparing the adjacent pixel signals according to a reference signal inputted through the first CDS block 610 and a ramp-up signal inputted through the second CDS block 620, and compare any one signal selected from a ramp-up signal $V_{RAMP+}$ and a ramp-down signal $V_{RAMP-}$ with a difference value between the adjacent pixel signals.

The feedback control unit 640 may output a first control signal including first and second switch control signals $S_1$ and $S_2$ for controlling first and second switches $SW_1$ and $SW_2$, according to the initial comparison signal provided from the comparison block 630, determine a ramp signal switching direction according to the reference comparison signal from the comparison block 630, and output a second control signal including second and third switch control signals $S_2$ and $S_3$ for controlling second and third switches $SW_2$ and $SW_3$. When the pixel signal of the comparison column is greater than the pixel signal of the adjacent column, the feedback control unit 640 may generate the second switch control signal $S_2$ for turning on the second switch $SW_2$ as shown in FIG. 6B. When the pixel signal of the comparison column is less than or equal to the pixel signal of the adjacent column, the feedback control unit 640 may generate the third switch control signal $S_3$ for turning on the third switch $S_3$ as shown in FIG. 6C.

The reference signal switching block 650 may switch the reference signal $V_{REF}$ to be applied to the first CDS block 610 according to the first control signal provided from the feedback control unit 640. The ramp signal select block 660 may select the ramp-up signal $V_{RAMP+}$ to be applied to the second CDS block 620 from the ramp signal generator 230 according to the first control signal provided from the feedback control unit 640, and select the ramp-up signal $V_{RAMP+}$ or the ramp-down signal $V_{RAMP-}$ to be applied to the second CDS block 620 from the ramp signal generator 230 according to the second control signal provided from the feedback control unit 640. The data conversion unit 670 may perform a data conversion operation according to a comparison signal of the comparison block 630. Here, the ramp signal generator 230 described with reference to FIG. 5 may generate the ramp-up signal $V_{RAMP+}$ and the ramp-down signal $V_{RAMP-}$ and apply them to the ramp signal select block 660 under the control of the control unit 280. The reference signal switch block 650 may receive the reference signal $V_{REF}$ from an external reference signal generator (not shown).

The analog-to-digital converter shown in FIG. 6A may store adjacent pixel signals and generate an initial comparison signal by comparing the adjacent pixel signals, generate a first control signal according to the initial comparison signal, generate a reference comparison signal by comparing the adjacent pixel signals according to the reference signal and the ramp-up signal switched according to the first control signal, determine a ramping direction according to the reference comparison signal and generate a second control signal, and perform a data conversion operation by selecting any one of the ramp-up signal and the ramp-down signal according to the second control signal, and comparing the selected ramp signal with a difference value between the adjacent pixel signals.

For example, the comparison block 630 may be embodied using a comparator 632, a switch $SW_{R1}$ and an amplifier 634. According to an embodiment, the comparison block 630 may be embodied using a comparator and a switch. The first CDS block 610 may be embodied using a switch $SW_{R2}$ and a first capacitor C1, and the second CDS block 620 may be embodied using a switch $SW_{R3}$ and a second capacitor C2. The switches $SW_{R1}$ to $SW_{R3}$ are turned on in response to an initial control signal $S_R$ provided from the control unit 280. The reference signal switching block 650 may be embodied using the first switch $SW_1$. The ramp signal select block 660 may be embodied using the second switch $SW_2$ and the third switch $SW_3$.

The data conversion unit 670 may directly receive the comparison signal of the comparison block 630 or receive the comparison signal through the feedback control unit 640 as illustrated in FIG. 6A. The data conversion unit 470 may include a counter and a memory. When the data conversion operation is completed, the corresponding block may be disabled to reduce standby power.

Referring to FIGS. 6A to 6D, an operation of the analog-to-digital converter will be described as follows.

First, the analog-to-digital converter may store adjacent pixel signals, generate an initial comparison signal by comparing the adjacent pixel signals, and generate a first control signal according to the initial comparison signal, at step S681. That is, at an initial stage, the analog-to-digital converter may receive and store the adjacent pixel signals, compare the two signals, and generate the initial comparison signal. The analog-to-digital converter may generate the first control signal for switching the reference signal and the ramp-up signal according to the initial comparison signal.

More specifically, during a period $t_1$, the switches $SW_{R1}$ to $SW_{R3}$ are turned on, and the first to third switches $SW_1$ to $SW_3$ are turned off. For instance, as the switches $SW_{R1}$ to $SW_{R3}$ are turned on under the control of the control unit 280, the pixel signal of the comparison column may be inputted so as to be stored in the first capacitor C1. In addition, since the switches $SW_{R1}$ to $SW_{R3}$ are turned on, the pixel signal of the adjacent column may be inputted so as to be stored in the second capacitor C2. The comparison block 630 may compare the adjacent pixel signals with each other and output the initial comparison signal to the feedback control unit 640. The feedback control unit 640 may generate the first control signal according to the initial comparison signal generated from the comparison block 630 and output the first control signal to the reference signal switching block 650 and the ramp signal select block 660. That is, the feedback control unit 640 may generate the first control signal including the first and second switch control signals $S_1$ and $S_2$ for controlling the first and second switches $SW_1$ and $SW_2$.

Thereafter, the analog-to-digital converter may compare the adjacent pixel signals according to the reference signal and the ramp-up signal switched according to the first control signal, generate a reference comparison signal, determine a ramping direction according to the reference comparison signal, and generate a second control signal, at step S682. That is, the analog-to-digital converter may switch the reference signal and select the ramp-up signal according to the first control signal. Thereby, when the previously stored adjacent pixel signals are changed according to the inputted reference signal and the ramp-up signal, the analog-to-digital converter may compare the changed adjacent pixel signals with each other and generate the reference comparison signal. As a result of the comparison in magnitudes of the adjacent pixel signals using the reference comparison signal, when the pixel signal of the comparison column is greater in voltage level than the pixel signal of the adjacent column, the ramping direction may be determined to a ramp-up direction and thus generate the second control signal for selecting the ramp-up signal. When the pixel signal of the comparison column is less in voltage level than or equal to the pixel signal of the adjacent column, the ramping direction may be determined to a ramp-down direction and thus generate the second control signal for selecting the ramp-down signal.

In more detail, during a period $t_2$, the switches $SW_{R1}$ to $SW_{R3}$ may be turned off, and the first and second switches $SW_1$ and $SW_2$ are turned on according to the first control signal. As the first switch $SW_1$ is turned on, the corresponding reference signal may be inputted to the first capacitor C1 to change the pixel signal of the comparison column that has been stored in the first capacitor C1. As the second switch $SW_2$ is turned on, the corresponding reference signal may be inputted to the second capacitor C2 to change the pixel signal of the adjacent column that has been stored in the second capacitor C2. The comparison block 630 may compare the changed adjacent pixel signals with each other and output the reference comparison signal to the feedback control unit 640. The feedback control unit 640 may compare the magnitudes of the adjacent pixel signals using the reference comparison signal. As a result of the comparison, when the pixel signal of the comparison column is greater in voltage level than the pixel signal of the adjacent column, the feedback control unit 440 may determine the ramping direction to a ramp-up direction, so that the second switch control signal $S_2$ for selecting the ramp-up signal is generated. At this time, the analog-to-digital converter maintains the current state since the second switch $SW_2$ has been already turned on and the ramp-up signal is being inputted. When the pixel signal of the comparison column is less in voltage level than or equal to the pixel signal of the adjacent column, the feedback control unit 440 may determine the ramping direction to a ramp-down direction, so that the third switch control signal $S_3$ for selecting the ramp-down signal are generated. That is, the feedback control unit 440 may generate the second control signal Including the second and third switch control signals $S_2$ and $S_3$.

Thereafter, the analog-to-digital converter may perform a data conversion operation by selecting one of the ramp-up signal and the ramp-down signal according to the second control signal, and comparing the selected ramp signal with a difference value between the adjacent pixel signals, at step S683. That is, the analog-to-digital converter may perform a data conversion operation by selecting the ramp-up signal according to the second control signal for selecting the ramp-up signal, and comparing the ramp-up signal with the difference value between the adjacent pixel signals, or may perform a data conversion operation by selecting the ramp-down signal according to the second control signal for selecting the ramp-down signal, and comparing the ramp-down signal with the difference value between the adjacent pixel signals.

More specifically, referring to FIG. 6B, during a period $t_3$, the second control signal for selecting the ramp-up signal is generated, that is, the second switch control signals $S_2$ for turning on the second switch $SW_2$ is generated. At this time, the analog-to-digital converter maintains the current state since the second switch $SW_2$ has been already turned on and the ramp-up signal is continuously inputted to the second CDS block 620. The comparison block 630 may compare the difference value between the adjacent pixel signals with the ramp-up signal, and output a comparison signal. Hence, the data conversion unit 670 may perform a data conversion operation in response to the comparison signal.

Referring to FIG. 6C, during a period $t_3$, the second control signal for selecting the ramp-down signal is generated, that is, the third switch control signals $S_3$ for turning on the third switch $SW_3$ is generated. Thus, the second switch $SW_2$ may be turned off so as to interrupt the ramp-up signal and the third switch $SW_3$ is turned on to transfer the ramp-down signal to the second CDS block 620. The comparison block 630 may compare the difference value between the adjacent pixel signals with the ramp-down signal, and output a comparison signal. Hence, the data conversion unit 670 may perform a data conversion operation in response to the comparison signal.

In accordance with embodiments, pixel noise which may be caused when a pixel signal is extracted may be effectively offset and canceled. That is, a method of offsetting noise by comparing two adjacent pixel signals in accordance with an embodiment may be the most effective existing noise canceling method. Since the effect of the method may be determined by the common mode rejection (CMR) characteristic of the comparison unit and the distance between the adjacent pixels is set to approximately several micrometers (μm), the pixel noise may be almost completely removed.

In accordance with various embodiments, a data conversion time according to image data is reduced, and thus data processing speed may be enhanced. More specifically, when the range of a data code which is finally converted into a digital code is a maximum of 10 bits, the data code may be set to 1,024 codes. In the conventional method, when the maximum code is 950 regardless of the form of image data, counting should be performed until the maximum code value is outputted. In various embodiments of the present disclosure, however, when the data codes of the entire pixels exist between 850 and 950 codes in the case when the maximum code is 950, only 100 codes may be counted. Thus, the data conversion time may be shortened.

In accordance with various embodiments, the data conversion time is reduced, whereby power consumption may be minimized. More specifically, when data conversion ends as described, the entire analog-to-digital blocks may be switched to the standby state, whereby the standby power consumption may be reduced.

In accordance with various embodiments, the number of counting operations required for a data conversion operation is reduced, whereby counting power consumption may be reduced. More specifically, in the conventional method, when the average data code of the entire pixel signals is 900, 900 counting operations must be performed. In the embodiments of the present disclosure, however, counting operations may be performed by a substantial difference value between adjacent pixel signals. This may be determined by the form of image data. In an extreme case, a data code difference value between adjacent pixels may be set to 1024. Such a case occurs at an evaluation step for evaluating the extreme operation characteristic, and a general natural image basically has continuity. Thus, the number of counting operations may be significantly reduced.

Although various embodiments of the present disclosure have been disclosed, those skilled in the art will appreciate that various modifications, additions and substitutions are possible, without departing from the scope and spirit of the disclosure. Therefore, the scope of the present disclosure must be defined by the appended claims and equivalents of the claims rather than by the description preceding them.

What is claimed is:

1. An analog-to-digital converter comprising:
   a ramp signal generator suitable for generating a ramp-up signal and a ramp-down signal;
   a first correlated double sampling (CDS) block suitable for receiving and storing a pixel signal of a comparison column and performing CDS;
   a second CDS block suitable for receiving and storing a pixel signal of an adjacent column, and performing CDS;
   a comparison block suitable for generating an initial comparison signal by comparing adjacent pixel signals provided from the first and second CDS blocks, generating a reference comparison signal by comparing the adjacent pixel signals according to a reference signal inputted through the first CDS block and the ramp-up signal inputted through the second CDS block, and comparing any one signal selected from the ramp-up signal and the ramp-down signal with a difference value between the adjacent pixel signals;
   a feedback control unit suitable for outputting a first control signal based on the initial comparison signal, and determining a ramping direction based on the reference comparison signal and outputting a second control signal;
   a reference signal switching block suitable for switching the reference signal to be applied to the first CDS block according to the first control signal;
   a ramp signal select block suitable for selecting the ramp-up signal to be applied to the second CDS block according to the first control signal, and selecting the ramp-up signal or the ramp-down signal to be applied to the second CDS block according to the second control signal; and
   a data conversion unit suitable for performing a data conversion operation according to a comparison signal of the comparison block.

2. The analog-to-digital converter of claim 1, wherein the analog-to-digital converter
   stores the adjacent pixel signals and generates the initial comparison signal by comparing the adjacent pixel signals,
   generates the first control signal based on the initial comparison signal,
   generates the reference comparison signal by comparing the adjacent pixel signals according to the ramp-up signal and the reference signal switched according to the first control signal,
   generates the second control signal by determining the ramping direction according to the reference comparison signal, and
   performs the data conversion operation by selecting any one of the ramp-up signal and the ramp-down signal according to the second control signal, and comparing the selected ramp signal with the difference value between the adjacent pixel signals.

3. The analog-to-digital converter of claim 1, wherein the feedback control unit:
   compares magnitudes of the adjacent pixel signals using the reference comparison signal, determines the ramping direction to a ramp-up direction and generates the second control signal for selecting the ramp-up signal, when the pixel signal of the comparison column is greater than the pixel signal of the adjacent column, and determines the ramping direction to a ramp-down direction and generates the second control signal for selecting the ramp-down signal, when the pixel signal of the comparison column is less than or equal to the pixel signal of the adjacent column.

4. The analog-to-digital converter of claim 1, wherein the analog-to-digital converter performs the data conversion operation by selecting the ramp-up signal according to the second control signal for selecting the ramp-up signal, and comparing the ramp-up signal with the difference value between the adjacent pixel signals, or performs the data conversion operation by selecting the ramp-down signal according to the second control signal for selecting the ramp-down signal, and comparing the ramp-down signal with the difference value between the adjacent pixel signals.

5. An analog-to-digital converter comprising:

a first correlated double sampling (CDS) block suitable for receiving and storing a pixel signal of a comparison column and performing CDS;

a second CDS block suitable for receiving and storing a pixel signal of an adjacent column and performing CDS;

a comparison block suitable for generating an initial comparison signal by comparing adjacent pixel signals provided from the first and second CDS blocks, and generating a reference comparison signal by comparing the adjacent pixel signals according to reference signals inputted through the first and second CDS blocks, and comparing any one signal selected from ramp signals to be applied to the first and second CDS blocks with a difference value between the adjacent pixel signals;

a feedback control unit suitable for outputting a first control signal based on the initial comparison signal, and determining a ramp signal switching direction based on the reference comparison signal, and outputting a second control signal;

a reference signal switching block suitable for switching the reference signals to be applied to the first and second CDS blocks according to the first control signal;

a ramp signal select block suitable for selecting the ramp signal to be applied to the first or second CDS block according to the second control signal; and a data conversion unit suitable for performing a data conversion operation according to a comparison signal of the comparison block.

6. The analog-to-digital converter of claim 5, wherein the analog-to-digital converter stores the adjacent pixel signals and generates the initial comparison signal by comparing the adjacent pixel signals, generates the first control signal based on the initial comparison signal, generates the reference comparison signal by comparing the adjacent pixel signals according to the reference signals switched according to the first control signal, generates the second control signal by determining a ramp signal switching direction according to the reference comparison signal, and performs the data conversion operation by interrupting any one of the reference signals to be applied to the first and second CDS blocks according to the second control signal, selecting any one ramp signal to be applied to the first or second CDS block, and comparing the selected ramp signal with the difference value between the adjacent pixel signals.

7. The analog-to-digital converter of claim 5, wherein the feedback control unit compares magnitudes of the adjacent pixel signals using the reference comparison signal, and determines the ramp signal switching direction to the first CDS block, selects the ramp signal to be applied to the first CDS block, and generates the second control signal for interrupting the reference signal to be applied to the first CDS block, when the pixel signal of the comparison column is greater than the pixel signal of the adjacent column, and determines the ramp signal switching direction to the second CDS block, selects the ramp signal to be applied to the second CDS block, and generates the second control signal for interrupting the reference signal to be applied to the second CDS block when the pixel signal of the comparison column is less than or equal to the pixel signal of the adjacent column.

8. The analog-to-digital converter of claim 5, wherein, depending on the second control signal, the analog-to-digital converter performs the data conversion operation by interrupting the reference signal to be applied to the first CDS block, selecting the ramp signal to be applied to the first CDS block, comparing the selected ramp signal with the difference value between the adjacent pixel signals, or performs the data conversion operation by interrupting the reference signal to be applied to the second CDS block, selecting the ramp signal to be applied to the second CDS block, and comparing the selected ramp signal with the difference value between the adjacent pixel signals.

9. An analog-to-digital conversion method comprising:

generating an initial comparison signal by storing adjacent pixel signals and comparing the adjacent pixel signals, and generating a first control signal based on the initial comparison signal;

generating a reference comparison signal by comparing the adjacent pixel signals based on a ramp-up signal and a reference signal switched according to the first control signal, and generating a second control signal by determining a ramping direction according to the reference comparison signal; and performing a data conversion operation by selecting any one of the ramp-up signal and a ramp-down signal according to the second control signal, and by comparing the selected ramp signal with a difference value between the adjacent pixel signals, wherein the performing of the data conversion operation includes:

performing the data conversion operation by selecting the ramp-up signal according to the second control signal for selecting the ramp-up signal, and by comparing the ramp-up signal with the difference value between the adjacent pixel signals, or performing the data conversion operation by selecting the ramp-down signal according to the second control signal for selecting the ramp-down signal, and comparing the ramp-down signal with the difference value between the adjacent pixel signals.

10. The analog-to-digital conversion method of claim 9, wherein the generating of the second control signal includes:

comparing magnitudes of the adjacent pixel signals using the reference comparison signal;

determining the ramping direction to a ramp-up direction, and generating the second control signal for selecting the ramp-up signal, when a pixel signal of a comparison column is greater than a pixel signal of an adjacent column; and determining the ramping direction to a ramp-down direction, and generating the second control signal for selecting the ramp-down signal, when the pixel signal of the comparison column is less than or equal to the pixel signal of the adjacent column.

11. An analog-to-digital conversion method comprising:

generating an initial comparison signal by storing adjacent pixel signals and comparing the adjacent pixel signals, and generating a first control signal based on the initial comparison signal;

generating a reference comparison signal by comparing the adjacent pixel signals based on reference signals switched according to the first control signal, and generating a second control signal by determining a ramp signal switching direction according to the reference comparison signal; and performing a data conversion operation by interrupting any one of the reference signals to be applied to first and second CDS blocks according to the second control signal, by selecting any one ramp signal to be applied to the first or second CDS block, and by comparing the selected ramp signal with a difference value between the adjacent pixel signals.

12. The analog-to-digital conversion method of claim 11, wherein the generating of the second control signal includes:

comparing magnitudes of the adjacent pixel signals using the reference comparison signal;

determining the ramp signal switching direction to the first CDS block, selecting the ramp signal to be applied to the first CDS block, and generating the second control signal for interrupting the reference signal to be applied to the first CDS block, when a pixel signal of a comparison column is greater than a pixel signal of an adjacent column; and determining the ramp signal switching direction to the second CDS block, selecting the ramp signal to be applied to the second CDS block, and generating the second control signal for interrupting the reference signal to be applied to the second CDS block, when the pixel signal of the comparison column is less than or equal to the pixel signal of the adjacent column.

13. The analog-to-digital conversion method of claim 11, wherein the performing of the data conversion operation includes:

performing the data conversion operation by interrupting the reference signal to be applied to the first CDS block, by selecting the ramp signal to be applied to the first CDS block, and by comparing the selected ramp signal with the difference value between the adjacent pixel signals, or performing the data conversion operation by interrupting the reference signal to be applied to the second CDS block, by selecting the ramp signal to be applied to the second CDS block, and by comparing the selected ramp signal with the difference value between the adjacent pixel signals.

* * * * *